United States Patent
Sutton

(10) Patent No.: US 9,304,177 B2
(45) Date of Patent: Apr. 5, 2016

(54) MOVABLE COIL SCANNER SYSTEMS AND METHODS

(71) Applicant: TDK Corporation, Tokyo (JP)

(72) Inventor: Robert Sutton, Cedar Park, TX (US)

(73) Assignee: TDK Corporation, Tokyo (JP)

( * ) Notice: Subject to any disclaimer, the term of this patent is extended or adjusted under 35 U.S.C. 154(b) by 306 days.

(21) Appl. No.: 13/849,306

(22) Filed: Mar. 22, 2013

(65) Prior Publication Data
US 2013/0249541 A1    Sep. 26, 2013

Related U.S. Application Data

(60) Provisional application No. 61/614,330, filed on Mar. 22, 2012.

(51) Int. Cl.
| | |
|---|---|
| *G01N 27/72* | (2006.01) |
| *G01R 33/12* | (2006.01) |
| *G01R 31/00* | (2006.01) |

(52) U.S. Cl.
CPC .............. *G01R 33/12* (2013.01); *G01R 31/001* (2013.01); *G01R 31/006* (2013.01)

(58) Field of Classification Search
CPC ...... G01N 27/72; G01R 33/12; G01R 31/001; G01R 31/006; H04N 7/18
USPC ......... 324/202, 219, 254, 306–309, 318–322, 324/207.15–207.17, 228–243, 257–262
See application file for complete search history.

(56) References Cited

U.S. PATENT DOCUMENTS

| | | | |
|---|---|---|---|
| 3,771,048 A | | 11/1973 | Bond et al. |
| 3,890,564 A | * | 6/1975 | Watanabe et al. ............. 324/225 |
| 4,326,198 A | * | 4/1982 | Novikoff .................... 340/572.2 |

(Continued)

FOREIGN PATENT DOCUMENTS

| | | |
|---|---|---|
| JP | 739078 | 2/1995 |
| JP | 200552365 A | 3/2005 |

(Continued)

OTHER PUBLICATIONS

International Search Report and Written Opinion of the International Searching Authority for related application PCT/US2013/033585 mailed on Jul. 12, 2013.

(Continued)

*Primary Examiner* — Patrick Assouad
*Assistant Examiner* — Lamarr Brown
(74) *Attorney, Agent, or Firm* — Allen J. Moss; Squire Patton Boggs (US) LLP

(57) ABSTRACT

A system, such as a magnetic immunity testing system, can include a first coil configured to generate a first magnetic field. The first coil can be disposed on a first side of a scanning volume and can have a first feed for supplying electric current to the first coil. A second coil can be similarly configured on an opposite side of a scanning volume, and a second magnetic field from the second coil can be combined with the first magnetic field to form a combined magnetic field. The coils can be provided with transporters that translate coils in at least one dimension. The system can also include a controller that is configured to control the transporters and the feeds to provide the combined magnetic field as a controlled and calibrated magnetic field over the scanning volume.

29 Claims, 13 Drawing Sheets

(56) References Cited

U.S. PATENT DOCUMENTS

| | | | |
|---|---|---|---|
| 4,804,912 A * | 2/1989 | Lysen | 324/207.17 |
| 5,172,056 A | 12/1992 | Voisin | |
| 5,311,125 A * | 5/1994 | Krause et al. | 324/201 |
| 5,502,387 A * | 3/1996 | McGill | 324/318 |
| 5,689,184 A * | 11/1997 | Jeffers et al. | 324/243 |
| 7,264,109 B2 * | 9/2007 | Raque et al. | 198/460.1 |
| 7,902,818 B2 * | 3/2011 | Bernard et al. | 324/207.26 |
| 8,907,680 B2 * | 12/2014 | Sakakibara et al. | 324/546 |
| 2002/0123681 A1 | 9/2002 | Zuk et al. | |
| 2002/0149365 A1 * | 10/2002 | DeMeester et al. | 324/307 |
| 2004/0169509 A1 * | 9/2004 | Czipott et al. | 324/246 |
| 2005/0072655 A1 * | 4/2005 | Raque et al. | 198/455 |
| 2005/0088178 A1 * | 4/2005 | Bolas et al. | 324/318 |
| 2007/0096857 A1 | 5/2007 | Webb et al. | |
| 2008/0007258 A1 * | 1/2008 | Bockstal | 324/260 |
| 2008/0297158 A1 * | 12/2008 | Heger et al. | 324/326 |
| 2009/0084777 A1 * | 4/2009 | Oh et al. | 219/672 |
| 2009/0115406 A1 * | 5/2009 | Anderson et al. | 324/207.17 |
| 2009/0167301 A1 * | 7/2009 | Ausserlechner | 324/252 |
| 2010/0141247 A1 * | 6/2010 | Candy | 324/239 |
| 2010/0148769 A1 * | 6/2010 | Choi et al. | 324/239 |
| 2010/0277163 A1 * | 11/2010 | Nakamura et al. | 324/228 |
| 2011/0181276 A1 * | 7/2011 | Moskalenko | 324/240 |
| 2012/0081106 A1 * | 4/2012 | Grinberg et al. | 324/207.15 |
| 2012/0200295 A1 * | 8/2012 | Kedzia et al. | 324/318 |
| 2012/0249138 A1 * | 10/2012 | Pfeuffer | 324/309 |
| 2013/0314081 A1 * | 11/2013 | Igney et al. | 324/239 |
| 2014/0232382 A1 * | 8/2014 | Goodyear et al. | 324/239 |

FOREIGN PATENT DOCUMENTS

| | | | |
|---|---|---|---|
| JP | 201088151 A | 4/2010 | |
| WO | 2010146482 A1 | 12/2010 | |

OTHER PUBLICATIONS

SAE International: "SAE J551-17; Vehicle Electromagnetic Immunity—Power Line Magnetic Fields", SAE Technical Paper Series, Society of Automotive Engineers, Warrendale, PA, US, vol. J551-17, Jan. 1, 2010.

Oeve W B: "Verfahren Der Elektromagnetischen Beeinflussung Von Draftfahrzeugelektronik: Eine Uebersicht", Elektrotechnik Und Informationstechnik, Springer Verlag, Wien, AT, vol. 112, No. 12, Dec. 1, 1995.

Spencer J D et al: "Helmholtz coils for MIL-STD-462D RS101 testing", Electromagnetic Compatibility, 1999 IEEE International Symposium on Seattle, WA, USA Aug. 2-6, 1999, Piscataway, NJ USA, IEEE, US, vol. 2, Aug. 2, 1999.

Mock P: "Feldeffekt. Simulation von Magnetfeldern fur EMV-Messungen // Simulation of magnetic fields for electromagnetic compatibility measurements", Elektronik-Praxis, Vogel, Wuerzburg, DE vol. 28, No. 21, Nov. 4, 1993.

Victor Choo et al: "The Development of a Large Three-Axis Magnetic Field Susceptibility Test (L-TAMFST) System", Electromagnetic Compatibility, 1997. IEEE 1997 International Symposium on Austin, TX, USA Aug. 18-22, 1997.

Katsuji Kaminishi: "Practical method of improving the uniformity of magnetic fields generated by single and double Helmholtz coils", Review of Scientific Instruments, vol. 52, No. 3, Mar. 1, 1981.

Milan Wayne Garrett: "Axially symmetric systems for generating and measuring magnetic fields. Part I", Journal of Applied Physics, American Institute of Physics. New York, US, vol. 22, No. 9, Sep. 1, 1951.

Examination Report issued Nov. 2, 2015 for related Japanese Patent Appl. No. 2014-553553.

* cited by examiner

MOVABLE COIL SCANNER SYSTEMS AND METHODS

CROSS REFERENCE TO RELATED APPLICATION

This application is related to and claims the priority of U.S. Provisional Patent Application No. 61/614,330, filed Mar. 22, 2012, which is hereby incorporated herein by reference in its entirety.

BACKGROUND

1. Field

Movable coil scanner systems and methods may be beneficial to a variety of testing environments and processes. For example, testing of vehicles such as automobiles may benefit from movable coil scanner systems that are configured to perform magnetic immunity testing.

2. Description of the Related Art

Conventional magnetic field generation and multi-coil use is mainly in two areas. A first area is calibration. In this area, coil configurations of specific geometries, for example, Helmholtz geometries, can be used to generate well behaved and predictable magnetic fields that can be used to calibrate magnetic field probes.

A second area is magnetic resonance imaging (MRI). In this area, coil configurations are used to generate well-calibrated localized magnetic field gradients across tissue specimens for medical imaging.

In these areas, generally fixed-coil configurations and small scanning volumes often are employed. Moreover, in the case of an MRI, typically the device under test is moved through the coil, rather than the coils being moved with respect to the test subject. For the case of calibration coils neither the device being calibrated nor the coils are moved.

Likewise, applications like MRI systems do not provide a direct magnetic field feedback mechanism. Instead such systems depend on the weak radiation radio frequency signal from the relaxation of hydrogen protons, which is proportional to the magnetic field the sample has been exposed to. Thus, MRI systems do not include a free space sensor or array of free space sensors placed within the test volume for magnetic field monitoring.

SUMMARY

A system according to certain embodiments includes a first coil configured to generate a first magnetic field. The first coil is disposed on a first side of a scanning volume and wherein the first coil comprises a first feed for supplying electric current to the first coil. The system also includes a second coil configured to generate a second magnetic field. The second coil is disposed opposite the first coil on a second side of the scanning volume opposite the first side. The second coil comprises a second feed for supplying electric current to the second coil, and wherein the first magnetic field and second magnetic field combine to form a combined magnetic field. The system also includes a first transporter configured to translate the first coil in at least one dimension. The system further includes a second transporter configured to translate the second coil in at least one dimension. The system additionally includes a controller that is configured to control the first transporter, the second transporter, the first feed, and the second feed to provide the combined magnetic field as a controlled and calibrated magnetic field over the scanning volume.

In certain embodiments, a method includes positioning a vehicle on a stationary platform within a scanner. The scanner includes a first coil configured to generate a first magnetic field, wherein the first coil is disposed on a first side of a scanning volume and wherein the first coil comprises a first feed for supplying electric current to the first coil. The scanner also includes a second coil configured to generate a second magnetic field. The second coil is disposed opposite the first coil on a second side of the scanning volume opposite the first side. The second coil comprises a second feed for supplying electric current to the second coil. The first magnetic field and second magnetic field combine to form a combined magnetic field. The scanner further includes a first transporter configured to translate the first coil in at least one dimension. The scanner additionally includes a second transporter configured to translate the second coil in at least one dimension. The method also includes scanning a scanning volume including the vehicle. The scanning comprises controlling the first transporter, the second transporter, the first feed, and the second feed to provide the combined magnetic field as a controlled and calibrated magnetic field over the scanning volume.

A system in certain embodiments includes first field generating means for generating a first magnetic field, wherein the first field generating means is disposed on a first side of a scanning volume and wherein the first field generating means comprises a first feeding means for supplying electric current to the first field generating means. The system also includes second field generating means for generating a second magnetic field, wherein the second field generating means is disposed opposite the first field generating means on a second side of the scanning volume opposite the first side, wherein the second field generating means comprises a second feeding means for supplying electric current to the second field generating means, and wherein the first magnetic field and second magnetic field combine to form a combined magnetic field. The system further includes first transport means for translating the first field generating means in at least one dimension. The system additionally includes second transport means for translating the second field generating means in at least one dimension. The system additionally includes control means for controlling the first transport means, the second transport means, the first feeding means, and the second feeding means to provide the combined magnetic field as a controlled and calibrated magnetic field over the scanning volume.

BRIEF DESCRIPTION OF THE DRAWINGS

For proper understanding of the invention, reference should be made to the accompanying drawings, wherein.

DETAILED DESCRIPTION

Figure 1:
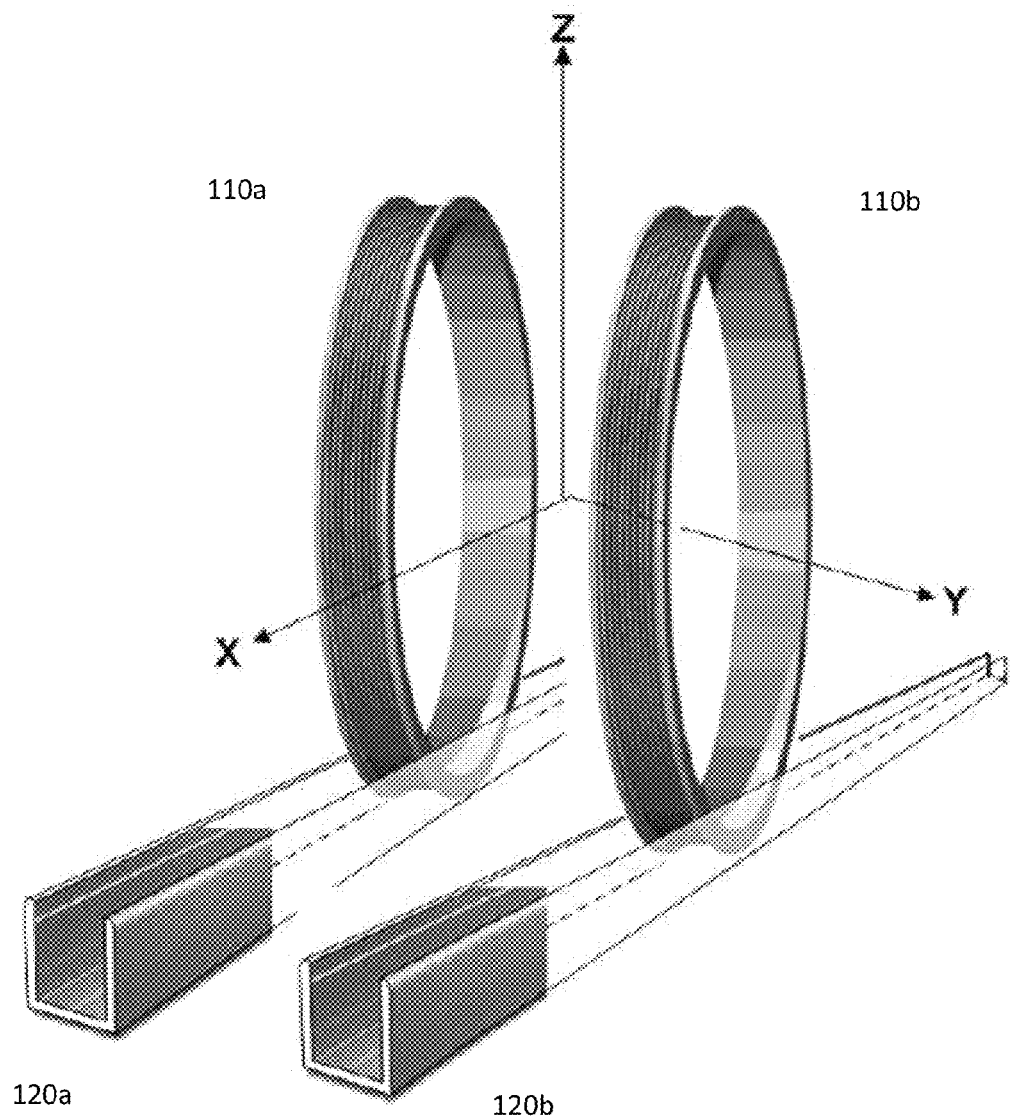
FIG. 1 illustrates coils mounted on tracks, according to certain embodiments.

Certain embodiments relate to a coil scanning system that can be used to generate a controlled and calibrated magnetic field over a large prescribed test volume. Certain embodiments, therefore, employ precision location and control of an array of field generating coils.

Certain embodiments can apply to volumes that are significantly larger than volumes addressed by MRI or calibration equipment. For example, certain embodiments may scan the volume of a motorcycle, a car, or a truck. For example, certain embodiments may have a scanning volume of 50 cubic feet to 5000 cubic feet, and more particularly from 100 cubic feet to 1000 cubic feet. Any volume suitable for a tested vehicle, however, may be accommodated by certain embodiments.

Fixed-coil configurations, such as the Helmholtz geometries, are not required in certain embodiments. Instead, mobile coil geometries in one or all dimensions can be employed. This may allow different field volumes to be addressed. Additionally, certain embodiments may allow the coils to be moved independently from one another which may shape the magnetic field in a certain location.

Certain embodiments do not require motion of the device under test through the coil. Rather, in certain embodiments, one or more coils can move while allowing the device under test, such as a vehicle, to be on a platform, such as a chassis dynamometer or lift, which may be stationary.

Moreover, certain embodiments provide free space field sensing. Thus, certain embodiments provide an independent feedback of the magnetic field in the free volume or loaded volume. The loaded volume can refer to the volume in which the device under test is present. More particularly, certain embodiments implement an array of free space field sensors, which may accurately map the magnetic field during the testing process.

Various magnetic fields may affect vehicles. For example, electric power lines, power systems of cars themselves, power systems of nearby cars, and inductive loop or other charging systems may impose significant magnetic fields on vehicles. These magnetic fields may affect various electronic components of a vehicle, such as the vehicle's light switches, magnetic relays, power distribution and the like. One standard for magnetic immunity is SAE J551-17, which is hereby incorporated herein by reference in its entirety. Accordingly, it may be beneficial to illuminate large volumes with a well-behaved, calibrated magnetic field.

Illuminating large volumes with a well-behaved calibrated magnetic field may require more than simply increasing the coil size to accommodate the test object. Increased coil size may result in a decrease in magnetic field intensity for a given current and a reduction in the high end frequency performance of the coil. Instead, a combination of a mobile coil system along with a positioning system can be used.

By combining a set of magnetic field generating coils and a motion system, a large volume can be scanned. As the coils move, the calibrated magnetic field can be scanned across the volume. Here, the term "scanned" is being used generally to include a variety of possible motions in any direction, and so is not limited to a particular left-to-right or right-to-left motion.

Such a system may provide a large test volume (for example, tens, hundreds, thousands, or more cubic feet), with good frequency response and suitable magnetic field requirements.

Moreover, certain embodiments provide a novel feed system and precision feedback sensors. Thus, certain embodiments can be used for a number of magnetic immunity functions where precision magnetic fields over large volumes are needed.

Magnetic immunity functions here can refer to tests that are made to determine the resistance of components or systems to magnetic fields of a particular strength. For example, automotive manufacturers may wish to confirm that their electronics will survive high strength magnetic field environments without compromising safety or functionality. A system that has high magnetic immunity may be one that survives high strength magnetic fields well, while a system that has low magnetic immunity may be one that fails easily in a high strength magnetic field.

Certain embodiments can include a number of large coils mounted on or to a motion rail system. The coils can form a mobile magnetic field radiating system. By virtue of the coils placement with respect to each other and the amount of current supplied to each coil, any number of magnetic field volumes and polarizations can be accommodated. The coil system can be configured in any combination of loop sizes and shapes depending on the requirements of the desired magnetic field.

FIG. 1 illustrates coils mounted on tracks according to certain embodiments. As shown in FIG. 1, a set of coils, coil 110a and coil 110b, can be mounted on independent movable tracks, track 120a and track 120b, as shown in FIG. 1. The tracks themselves may be movable, or the tracks may be fixed and the coils may move on the tracks using a trolley or other means such as a rail system.

A magnetic coil radiating system can be a coil or coils formed by a number of windings around a fixed structure. Traditionally, the structure and coils remain stationary. When a current is passed through the coil, a related magnetic field is produced. Using Ampere's law, it may be possible to determine the magnetic field associated with a given current or the current associated with a given magnetic field, providing there is no time changing electric field present. Therefore, when the coils are supplied with a current, they act as a magnetic field source with the axis of the source being the axis of the coils.

In FIG. 1, a coil pair is placed on movable tracks which allow the magnetic field to be produced in a particular volume around an object under test. In the case illustrated in FIG. 1, the maximum magnetic field is in the Y-direction.

A number of variations can be made from the above features. For example, each coil can be independently controlled to produce a magnetic field. Superposition of the magnetic fields can create a composite magnetic field in the area of interest between the coils. The coils may be driven in series to produce the magnetic field within the test volume, although other ways of driving the coils are also permitted. A plane of symmetry in the X-Z plane in the center of the coils can be produced by driving the coils. The coils may generate a magnetic field with the largest magnitude in the direction of the axis of the coils, the Y-direction.

The array of movable coils described above can be varied so that the major magnetic component is in the X-direction or the Z-direction, or any arbitrary vector with X, Y, and/or Z components.

The number and relative position of the coils can be changed. For example, instead of a plurality of coils, only a single coil is used in certain embodiments. Moreover, in certain embodiments an array of movable coils can be arranged in any combination of axes, such as one coil in one axis, and another coil in another orthogonal or non-orthogonal axis. Moreover, multiple coils may be arranged in multiple orthogonal or non-orthogonal axes.

Furthermore, according to certain embodiments, three or more coils can be arranged in a Maxwell coil arrangement, in which three coils are appropriately sized to be oriented on a virtual sphere, with the two outer coils having a radius of Sqrt(4/7) times the radius of the large center coil and placed Sqrt(3/7) times the radius of the large center coil from the plane of the center coil, the smaller coils having 49/64ths of the ampere-turns of the center coil. This, however, is just one example of a particular embodiment.

The shape and composition of the coils can be changed. For example, the arrays of coils shown in the figures have a circular cross-section in the direction of the axis, but square cross-section or oval cross-section or indeed any desired cross-section embodiments are also possible. Moreover, in certain embodiments each of the arrays of coils can be reconfigurable or separable coils.

Figure 2:
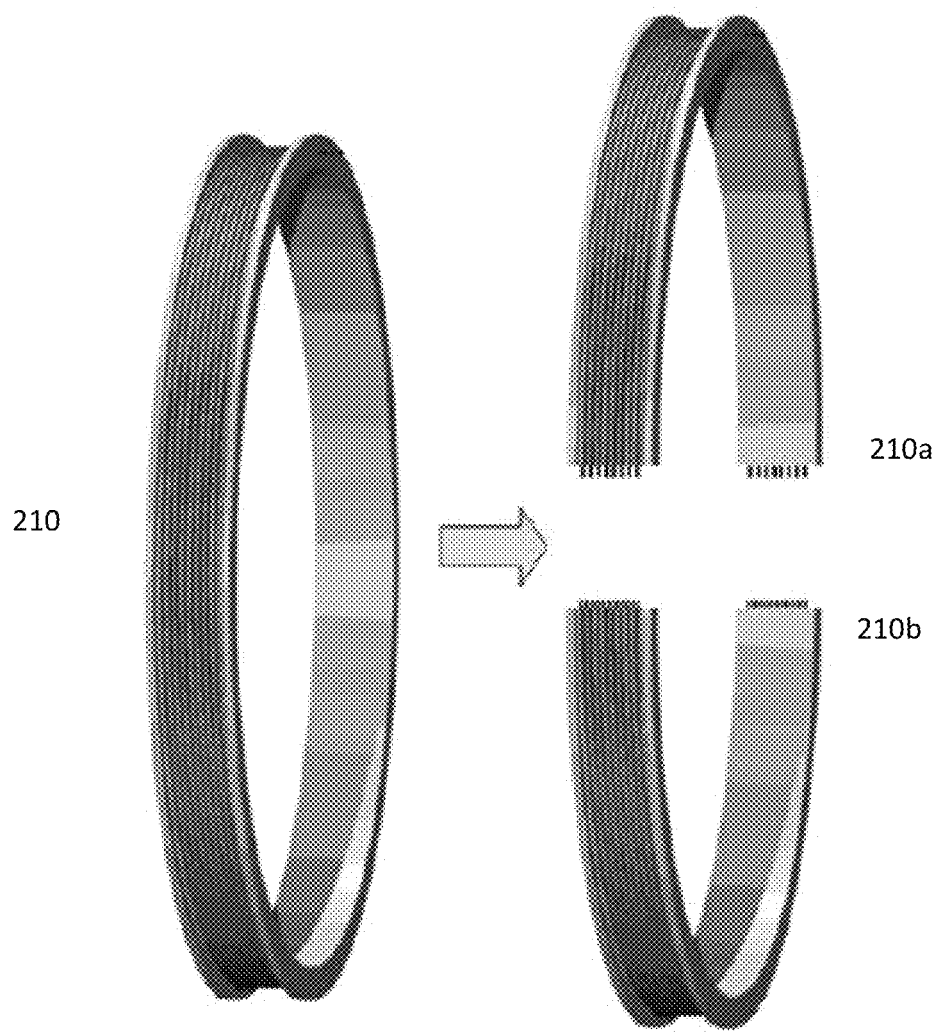
FIG. 2 illustrates a split coil, according to certain embodiments.

FIG. 2 illustrates a split coil according to certain embodiments. As shown in FIG. 2, a coil 210 can be separated into two or more segments 210a and 210b, allowing the coil to be stored or removed easily.

The tracks shown in FIG. 1 show motion possible in the X direction, but the coils can be arranged to be conveyed in other directions, such as in both the X and the Y directions, in the Z direction, or in any combination of X, Y, and Z directions. Such configurations may provide for increased mobility with respect to the separation distance and offset distance of the coils. For example, it is not required that the coils be spaced a radius of the coils apart or even an integer number of radiuses apart.

Each coil can include numerous windings. The coils can be formed of materials such as copper, aluminum or any other desired material, and may have a Litz-wire or any other desired configuration. Likewise, the feeds may similarly be constructed of copper, aluminum or any other desired material, and may be arranged in a Litz-wire or any other desired configuration. For example, other non-ferrous conductors, such as silver or gold, are also permitted. A braided type of wire may be used and may, for example, help to reduce capacitive effects at higher frequencies.

Various embodiments may be scalable in frequency. Thus, certain embodiments may be able to produce a calibrated magnetic field over a range of input frequencies.

Figure 3:
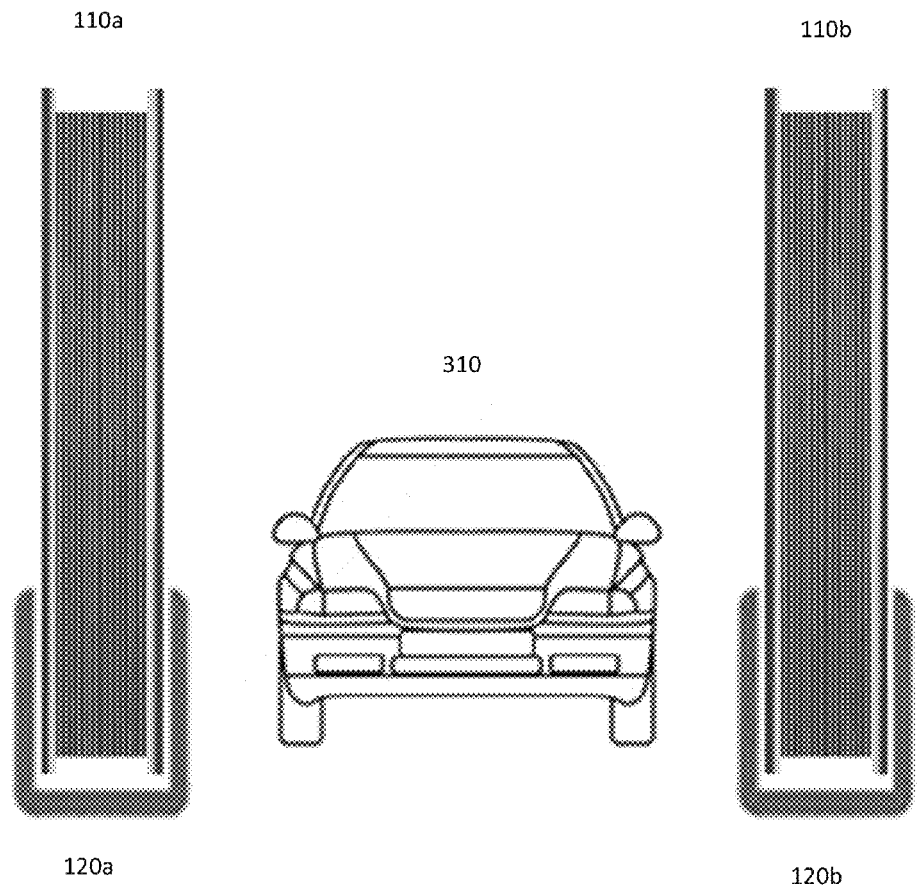
FIG. 3 illustrates a front view of a test scenario, according to certain embodiments.

FIG. 3 illustrates a front view of a test scenario according to certain embodiments. As shown in FIG. 3, the coil pair of coils 110a and 110b can exhibit two planes of magnetic symmetry—symmetry in the X-Y and symmetry in the X-Z plane. Thus, car 310, placed between tracks 120a and 120b, can have its magnetic immunity tested.

When the coils are symmetrically aligned, as opposed to offset, there can be symmetry along all axes/planes. So, in the case of FIG. 1 the Y directed flux density along the Y-axis, which can be called $B_y(y)$, may be characterized as follows for a given supply current and coil design. The center of the coils at the origin may be 0, the maxima may be in the middle of each coil, and the coils are 3 m apart. In this case, the flux density values can be measured along the y-axis, as the z and x variables are held to 0.

Figure 12:
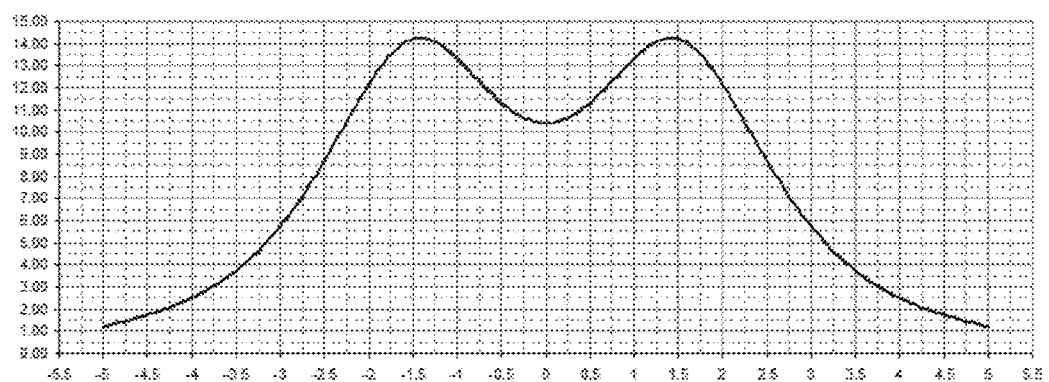
FIG. 12 illustrates y-directed flux density with respect to the y-axis, according to certain embodiments.

FIG. 12 illustrates y-directed flux density with respect to the y-axis, according to certain embodiments. The numbers on the left are the magnetic flux density measured in Gauss, which is proportional to the magnetic field density, along the y-axis for the $B_y$ flux density.

Figure 13:
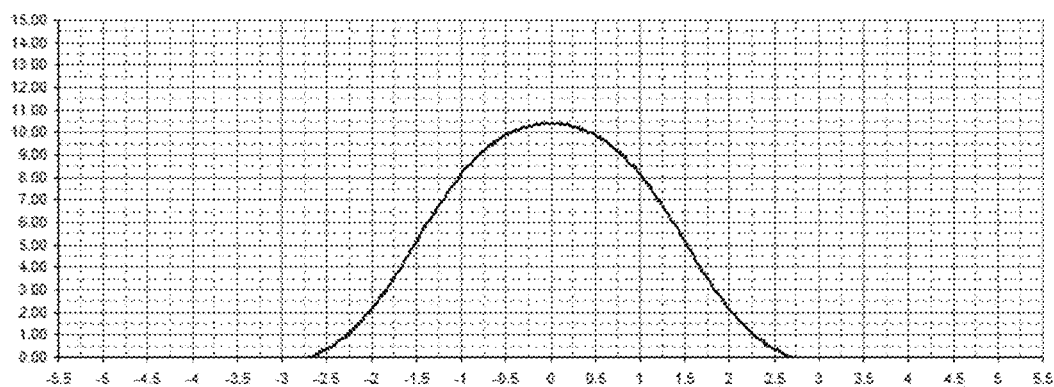
FIG. 13 illustrates x or z-directed flux density with respect to the y-axis, according to certain embodiments.

By contrast, FIG. 13 illustrates x or z-directed flux density with respect to the y-axis, according to certain embodiments. Both the x-directed flux density and the z-directed flux density are the same in this example illustration. Again, the numbers on the left are the magnetic flux density measured in Gauss, which is proportional to the magnetic field density, along the x and z-axes for the $B_y$ flux density.

In practice, the effects of the proximity to ground can skew the symmetry of one of these coils. Moreover, the shape of the magnetic flux density distribution can also change when the coils are offset. Thus, FIGS. 12 and 13 merely represent a simple illustration of a particular case.

FIG. 3 more particularly illustrates a dual coil setup from a front view of test volume. The coil system allows the device under test, in this case car 310, to be stationary while the coil system is moved around it. This also allows the device under test to be exercised. For example, the driven wheels of car 310 can be placed on a dynamometer and the engine can be operated, as though the car were driving at high speed with the wheels rotating, even though the car 310 itself may be largely stationary.

Figure 4:
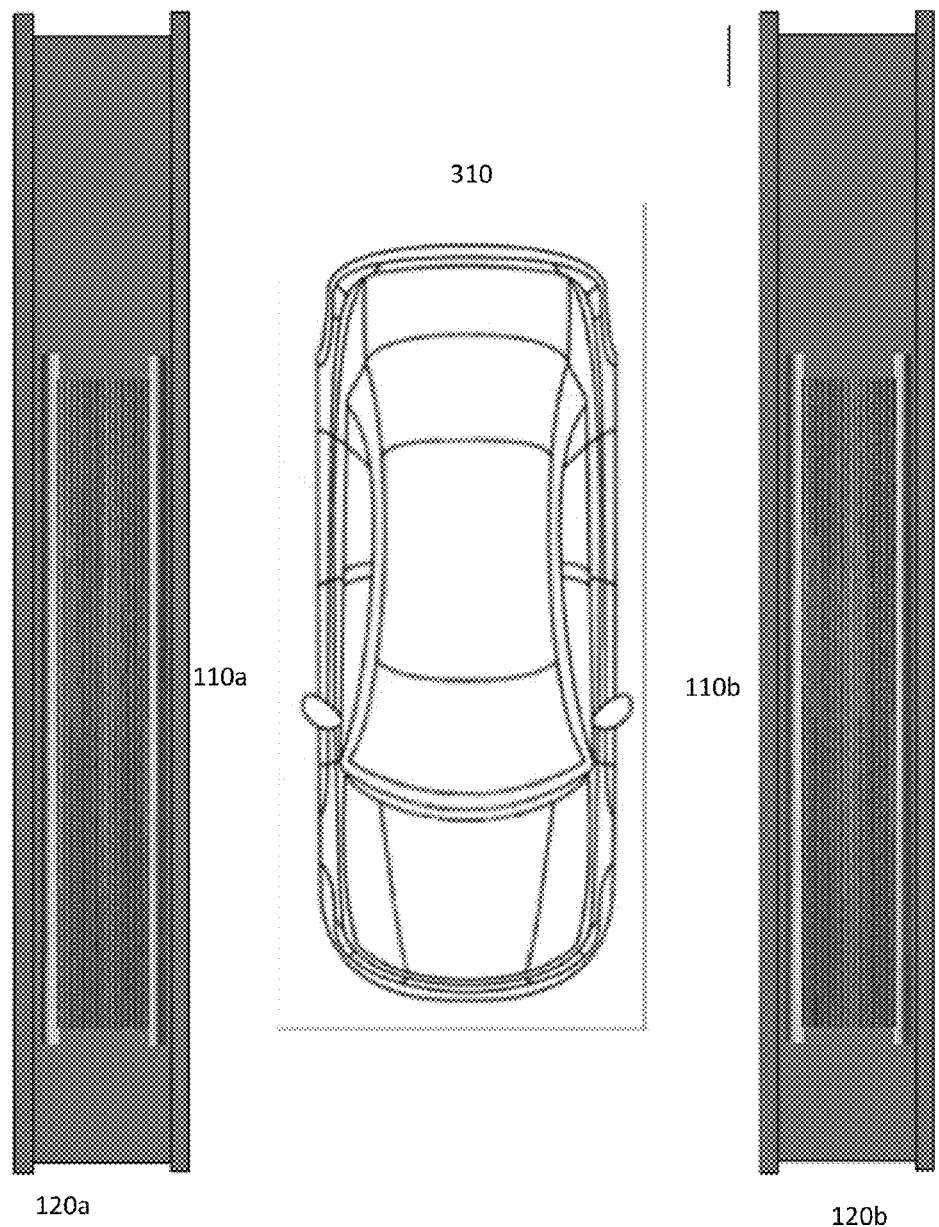
FIG. 4 illustrates a top view of a test scenario, according to certain embodiments.

FIG. 4 illustrates a top view of a test scenario according to certain embodiments. In FIG. 4, the device under test is aligned with the X-axis. In this view it is easy to see that coils 110a and 110b can move along the tracks 120a and 120b. Thus, a center portion of the magnetic field can selectively, magnetically test a particular portion of car 310.

Figure 5:
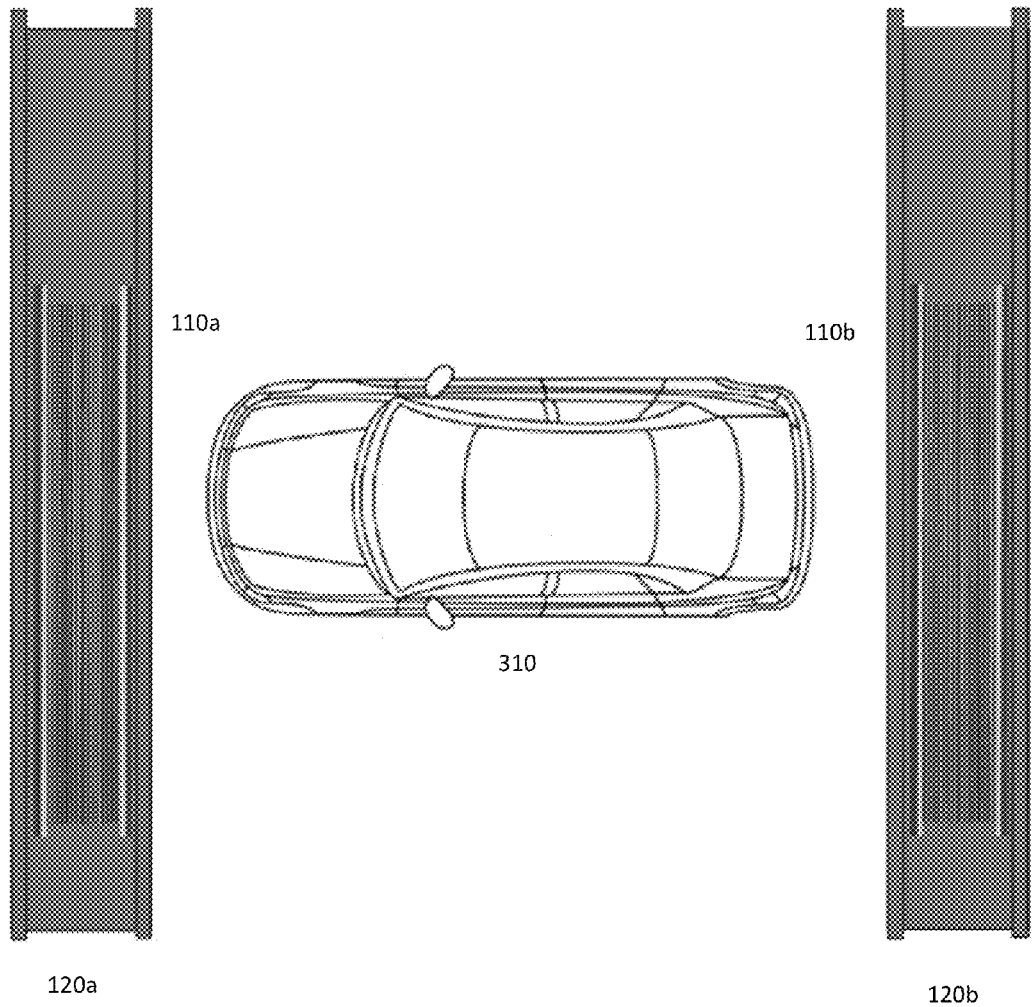
FIG. 5 illustrates a dual coil setup top view of test volume with the device under test aligned along the Y-axis according to certain embodiments.

As mentioned above, other orientations of the coils with respect to coordinate axes are possible. For example, FIG. 5 illustrates a dual coil setup top view of test volume with the device under test aligned along the Y-axis according to certain embodiments. Thus, in FIG. 5 the car 310 is axially aligned with the magnetic field produced by coils 110a and 110b. Moreover, motion of the coils 110a and 110b on tracks 120a and 120b can be used to selectively test portions of car 310 or to precisely align with the car 310.

Figure 6:
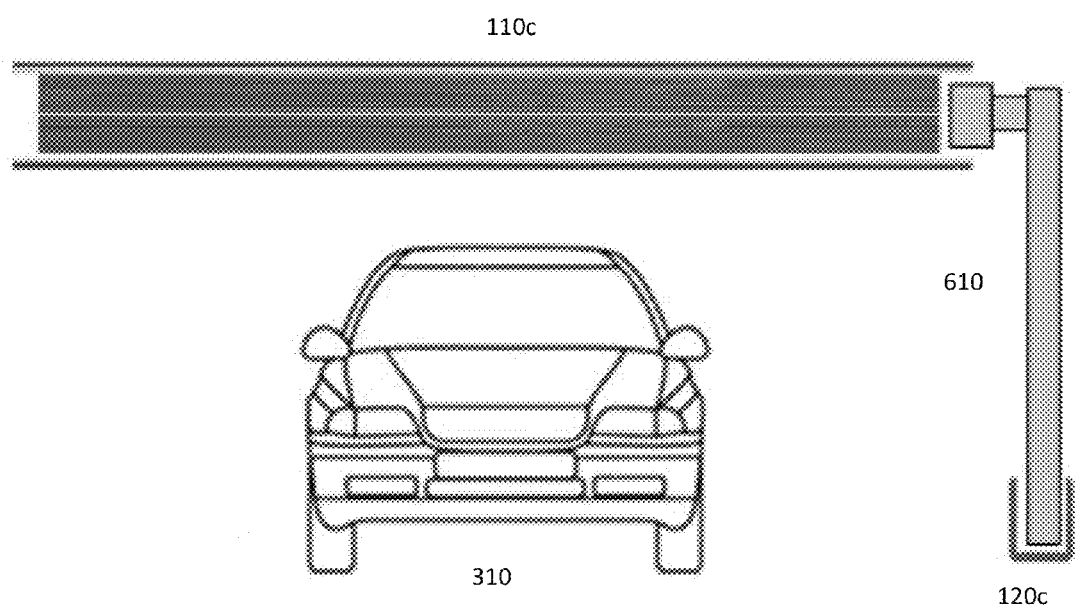
FIG. 6 illustrates a single coil setup front view of test volume, according to certain embodiments.

FIG. 6 illustrates a single coil setup front view of test volume, according to certain embodiments. As shown in FIG. 6, the device under test (in this case car 310) can be aligned along the Y-axis and magnetic field generation can occur in the Z-direction, using coil 110c on track 120c. The coil can be supported by a frame 610, which is illustrated on one side of car 310, but could be present on both sides of car 310.

Various advantages may be gained by implementing an array of movable coils in any combination of axes and alignments. For example, FIG. 7 illustrates a coil array with additional shaping coils on axis, according to certain embodiments.

Figure 7:
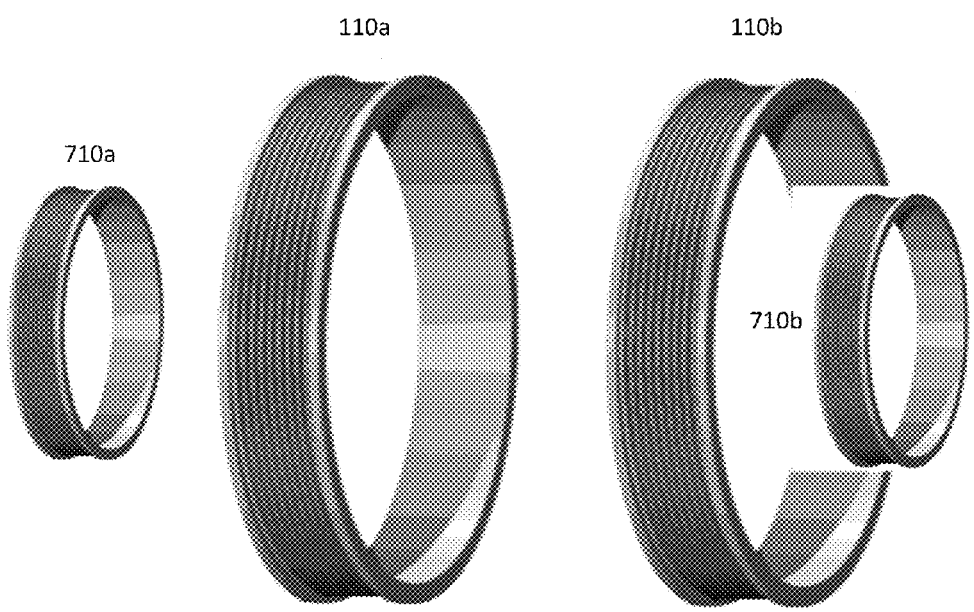
FIG. 7 illustrates a coil array with additional shaping coils on axis, according to certain embodiments.

As shown in FIG. 7, there may be two main coils 110a and 110b. There may also be two shaping coils 710a and 710b. The addition of coils, such as coils 710a and 710b, to the axes or off-axes can be used to help shape the magnetic field in between the two main coils 110a and 110b.

A simple two dimensional illustration can help describe how this can be done. As coil separations get larger for larger test objects or larger test volumes, the field between the coils can tend to sag in the center. One goal may be to have a flat magnetic field distribution across the center of the volume in as many dimensions as possible. This may be approximated by changing the magnetic field properly in that region with shaping coils. The sagging of the field between the coils may also be mitigated by increasing the coil size. However, increasing the coil size may reduce the upper frequency, more materials may be needed, and higher currents may be necessary to generate the same field levels.

Figure 8:
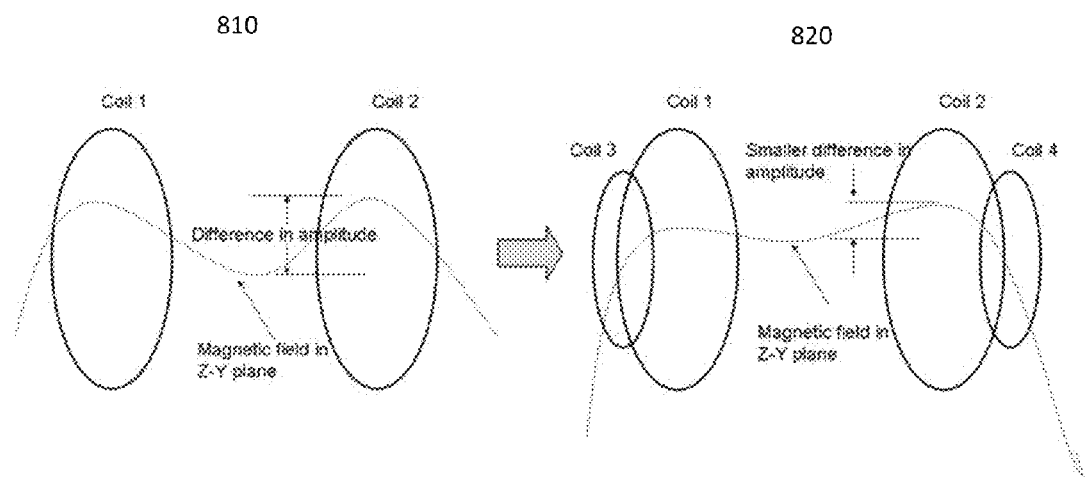
FIG. 8 illustrates a two dimensional example of field uniformity improvement based on additional coil implementation, according to certain embodiments.

FIG. 8 illustrates a two dimensional example of field uniformity improvement based on additional coil implementation according to certain embodiments. As illustrated in FIG. 8, the addition of coil 3 and 4 (at 820) to coil 1 and coil 2 (at 810) can be used to "flatten" out the magnetic field across the Z-Y plane. In the same manner, coils can be spaced in other locations with respect to the main coil to shape the field accordingly. The group of coils taken together can be utilized as part of the multi-coil scanner. That is, the coil group taken together can be a single system.

Figure 9:
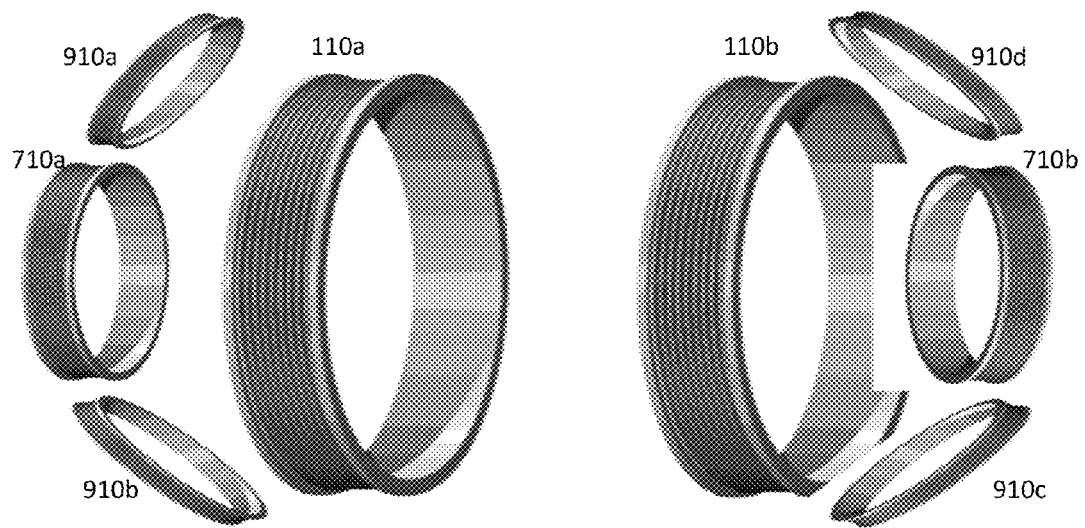
FIG. 9 illustrates a coil array with additional shaping coils on and off axis, according to certain embodiments.

FIG. 9 illustrates a coil array with additional shaping coils on and off axis, according to certain embodiments. As shown in FIG. 9, in addition to the two main coils 110$a$ and 110$b$, there may be on axis shaping coils 710$a$ and 710$b$, as well as off-axis shaping coils 910$a$, 910$b$, 910$c$, and 910$d$.

Figure 10:
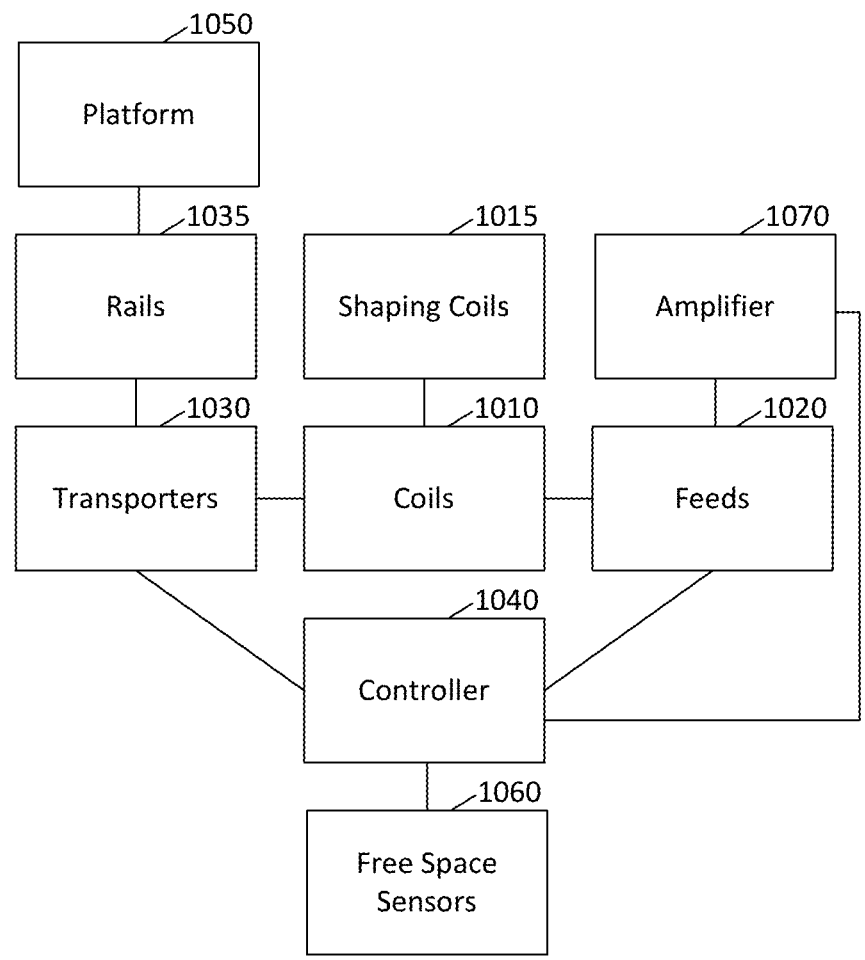
FIG. 10 illustrates a system, according to certain embodiments.

FIG. 10 illustrates a system according to certain embodiments. As shown in FIG. 10, in certain embodiments a system may include a plurality of coils 1010, including a first coil configured to generate a first magnetic field. The first coil can be disposed on a first side of a scanning volume. Feeds 1020 can also be provided. For example, the first coil can include a first feed for supplying electric current to the first coil. Likewise, a second coil can be configured to generate a second magnetic field. The second coil can be disposed opposite the first coil on a second side of the scanning volume opposite the first side. The second coil can include a second feed for supplying electric current to the second coil. The first magnetic field and second magnetic field can combine to form a combined magnetic field.

The coils 1010 can be sized as desired. However, the coils 1010 may be between 1 meter (or smaller) and 10 meters (or larger) in diameter. For example, a diameter of between 1 meter and 10 meters can be used for a circular or other desired-shape coil. And a side length of between 1 meter (or smaller) and 10 meters (or larger) per side can be used for a square or other desired-shape coil.

Transporters 1030 can also be provided in the system. For example, a first transporter can be configured to translate the first coil in at least one dimension. The transporters 1030 can be variously configured as rail cars, trolleys, or indeed any desired structure to transport the coils 1010. The transporters 1030 can be operated independently from one another. Thus, a second transporter configured to translate the second coil in at least one dimension can be operated independently of the first transporter, although it can also be operated in unison.

The system can also include a controller 1040. The controller can be configured to control the transporters 1030 and the feeds 1020 to provide the combined magnetic field as a controlled and calibrated magnetic field over the scanning volume. The controller 1040 can be any computing device, such as a central processing unit (CPU) or application specific integrated circuit (ASIC). Multiple cores or multiple processors can form a single controller, and multiple controllers can be employed in coordination as a single controller.

The feeds 1020 can include a first secondary coil on the first side or a first plurality of secondary coils on the first side, as well as a second secondary coil on the second side or a second plurality of secondary coils on the second side.

The system can also include a plurality of shaping coils 1015 configured to shape the combined magnetic field. At least one of the shaping coils 1015 can be provided on-axis with respect to the combined magnetic field and at least one of the shaping coils can be provided off-axis with respect to the combined magnetic field.

The system can further include rails 1035, including a first rail configured to support the first transporter and a second rail configured to support the second transporter. The rails 1035 can be made of a non-ferrous substance, or generally a non-metallic substance. For example, the rails 1035 can be made of a substance that does not perturb, or at least limit the disturbance of, the magnetic field.

The coils 1010 and shaping coils 1015 of the system can be configured in a non-Helmoltz coil configuration, although a Helmoltz coil configuration is also permitted.

The scanning volume can be from 50 to 5000 cubic feet or more particularly from 100 to 1000 cubic feet. The specific volume may depend on the target to be tested. In certain embodiments, the scanning area may effectively be a horizontal box, with a height defined by the height of the coils, the width defined by the spacing of the coils, and the length defined by the length of the rails. In such embodiments, the cross section of the box may be sized to accommodate the cross-section of the target, which may be a motorcycle, an all-terrain vehicle (ATV), a car, a truck, a plane, or any other vehicle. Other test subjects besides vehicles are also permitted.

A cross-section of each of the coils 1010 in the axis of a magnetic field can be circular, square, or oval. Other shapes are also permitted. Moreover, the coils 1010 can each be configured to be reconfigurable or separable.

The transporters 1030 can each be configured to translate the first coil in three dimensions and to rotate the first coil in three axes.

The system can also include platform 1050, which is configured to receive a test subject within the scanning volume. The platform 1050 can be outside of (e.g., under) the scanning volume or even within the scanning volume. The platform 1050 is illustrated as connected to rails 1035, but this is not a requirement.

The platform 1050 can include a chassis dynamometer or lift. The dynamometer can be configured to permit the vehicle to run while staying within the scanning volume.

The system can also include an array of free space field sensors 1060. The controller 1040 can be configured to control the magnetic field based on feedback from the sensors 1060.

The controller can 1040 further be configured to control the polarity of the magnetic field. Moreover, the controller 1040 can also be configured to control the magnetic field based on sensing an electric current supplied to the first coil, the second coil or any other coils employed by the system. The controller 1040 can be configured to provide, to coils 1010 or any other coils used by the system, a continuous wave (CW) signal, as opposed to a gradient signal. For example, the controller 1040 can provide a sinusoidal signal or any other desired signal pattern, rather than a triangle wave signal, to the coils 1010 or any other coils used by the system.

Certain embodiments may be able to supply a CW (continuous wave) signal and/or a modulated signal, such as an amplitude modulated (AM) signal, a pulsed signal, or any other modulated signal. However, certain embodiments may not need to provide a gradient field, which may, for example, resemble a triangular wave in the time domain. Rather, certain embodiments may provide a stable uniform field across the volume.

The coils 1010 can be arranged such that the first coil and the second coil are connected in series. Other connection arrangements are also permitted. For example, a plurality of parallel or independent feed arrangements can be used. These may be controlled to shape the magnetic field according to a desired specifications. Moreover the coils 1010 can be fed out of phase to trim a field. Such a trimming through out of phase feeding may be able to negate or counteract effects such as ground proximity in the volume.

The system can also include an amplifier 1070 provided at an input to the first coil or the second coil. The amplifier 1070 can be powered by an external power supply and can be controlled by the controller 1040.

The controller 1040 can be configured to maintain a predetermined degree of flatness of the combined magnetic field.

Figure 11:
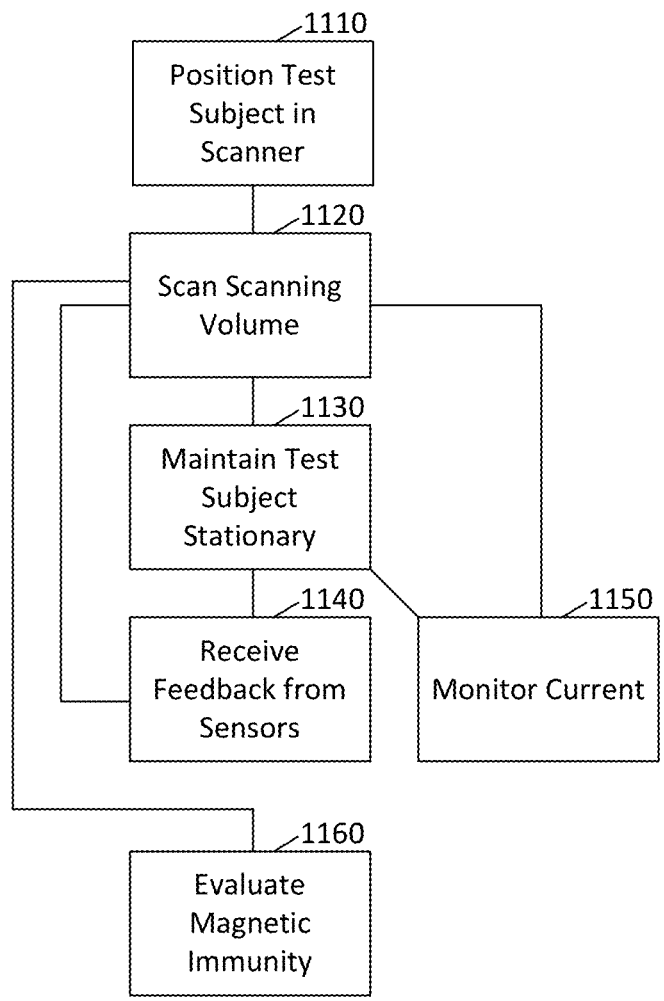
FIG. 11 illustrates a method, according to certain embodiments.

FIG. 11 illustrates a method according to certain embodiments. As shown in FIG. 11, a method can include, at 1110, positioning a vehicle or other test subject on a stationary platform. Although a stationary platform is one embodiment, a moveable platform, such as a turntable, may also be used in certain embodiments.

The method can also include, at 1120, using a scanner to scan a volume including the vehicle. The scanner providing a magnetic field for the device under test can be, for example, the system of FIG. 10 in any of its variations. The scanning can include controlling the first transporter, the second transporter, the first feed, and the second feed of the scanner to provide a combined magnetic field as a controlled and calibrated magnetic field over the scanning volume.

The method can also include, at 1130, maintaining the vehicle and platform stationary during the scanning.

The method can further include, at 1140, receiving feedback from an array of free space field sensors, wherein the controlling the magnetic field is based on the feedback.

The method can additionally include, at 1150, monitoring current into the first coil, the second coil or any other coil employed by the system. The controlling the magnetic field can be based on the monitored current.

The method can further include, at 1160, evaluating magnetic immunity of the test subject after the scanning is complete, while the scanning is on-going, or both. For example, the evaluating can include monitoring the function of the vehicle or one or more components or systems of the vehicle. For instance, in a destructive testing embodiment, the strength of the magnetic field may be gradually increased until failure of the component or system under test is detected.

The method may be implemented in hardware or software configured to run on hardware. For example, a non-transitory computer readable medium may be encoded with instructions that, when executed in hardware, perform the features of the above-described method.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. For example, the coils could be provided in a tunnel configuration (in which a vehicle under test extends through an aperture formed by each coil of the plurality of coils in a direction of the axis of the coils), other items than vehicles could be tested, and other modifications can be made. In order to determine the metes and bounds of the invention, therefore, reference should be made to the appended claims.

I claim:

1. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
a first secondary coil on the first side.

2. The system of claim 1, further comprising:
a first plurality of secondary coils on the first side.

3. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
a second secondary coil on the second side.

4. The system of claim 3, further comprising:
a second plurality of secondary coils on the second side.

5. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;

a second transporter configured to translate the second coil in at least one dimension;

a controller, wherein the controller is configured to control the first transporter, the second transporter, the first feed, and the second feed to provide the combined magnetic field as a controlled and calibrated magnetic field over the scanning volume; and a plurality of shaping coils configured to shape the combined magnetic field.

6. The system of claim 5, wherein at least one of the shaping coils is provided on-axis with respect to the combined magnetic field and at least one of the shaping coils is provided off-axis with respect to the combined magnetic field.

7. A system, comprising:

a first coil configured to generate a first magnetic field, wherein the first coil is disposed on a first side of a scanning volume and wherein the first coil comprises a first feed for supplying electric current to the first coil;

a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;

a first transporter configured to translate the first coil in at least one dimension;

a second transporter configured to translate the second coil in at least one dimension;

a controller, wherein the controller is configured to control the first transporter, the second transporter, the first feed, and the second feed to provide the combined magnetic field as a controlled and calibrated magnetic field over the scanning volume; and a first rail configured to support the first transporter.

8. A system, comprising:

a first coil configured to generate a first magnetic field, wherein the first coil is disposed on a first side of a scanning volume and wherein the first coil comprises a first feed for supplying electric current to the first coil;

a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;

a first transporter configured to translate the first coil in at least one dimension;

a second transporter configured to translate the second coil in at least one dimension;

a controller, wherein the controller is configured to control the first transporter, the second transporter, the first feed, and the second feed to provide the combined magnetic field as a controlled and calibrated magnetic field over the scanning volume; and a second rail configured to support the second transporter.

9. A system, comprising:

a first coil configured to generate a first magnetic field, wherein the first coil is disposed on a first side of a scanning volume and wherein the first coil comprises a first feed for supplying electric current to the first coil;

a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;

a first transporter configured to translate the first coil in at least one dimension;

a second transporter configured to translate the second coil in at least one dimension;

a controller, wherein the controller is configured to control the first transporter, the second transporter, the first feed, and the second feed to provide the combined magnetic field as a controlled and calibrated magnetic field over the scanning volume; and wherein the coils of the system are configured in a non-Helmoltz coil configuration.

10. A system, comprising:

a first coil configured to generate a first magnetic field, wherein the first coil is disposed on a first side of a scanning volume and wherein the first coil comprises a first feed for supplying electric current to the first coil;

a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;

a first transporter configured to translate the first coil in at least one dimension;

a second transporter configured to translate the second coil in at least one dimension;

a controller, wherein the controller is configured to control the first transporter, the second transporter, the first feed, and the second feed to provide the combined magnetic field as a controlled and calibrated magnetic field over the scanning volume; and wherein the scanning volume is from 100 to 1000 cubic feet.

11. A system, comprising:

a first coil configured to generate a first magnetic field, wherein the first coil is disposed on a first side of a scanning volume and wherein the first coil comprises a first feed for supplying electric current to the first coil;

a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;

a first transporter configured to translate the first coil in at least one dimension;

a second transporter configured to translate the second coil in at least one dimension;

a controller, wherein the controller is configured to control the first transporter, the second transporter, the first feed, and the second feed to provide the combined magnetic field as a controlled and calibrated magnetic field over the scanning volume; and wherein the first transporter is configured to translate the first coil in three dimensions and to rotate the first coil in three axes.

12. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
wherein the second transporter is configured to translate the second coil in three dimensions and to rotate the second coil in three axes.

13. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
a platform configured to receive a test subject within the scanning volume, wherein the platform is under the scanning volume.

14. The system of claim 13, wherein the platform comprises a chassis dynamometer or lift.

15. The system of claim 14, wherein the dynamometer is configured to permit the vehicle to run while staying within the system.

16. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
an array of free space field sensors, wherein the controller is configured to control the magnetic field based on feedback from the sensors.

17. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
wherein the controller is further configured to control the polarity of the magnetic field.

18. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
wherein the controller is further configured to control the magnetic field based on sensing an electric current supplied to the first coil and the second coil.

19. The system of claim 10, wherein the first coil and the second coil are connected in series.

20. The system of claim 10, further comprising:
an amplifier provided at an input to the first coil or the second coil.

21. The system of claim 10, wherein a cross-section of the first coil or the second coil in the axis of a magnetic field is square.

22. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
wherein a cross-section of the first coil or the second coil in the axis of a magnetic field is oval.

23. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
wherein the first coil or the second coil is configured to be reconfigurable or separable.

24. A system, comprising:
a first coil configured to generate a first magnetic field, wherein the first coil is disposed on a first side of a scanning volume and wherein the first coil comprises a first feed for supplying electric current to the first coil;
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field;
a first transporter configured to translate the first coil in at least one dimension;
a second transporter configured to translate the second coil in at least one dimension;
a controller, wherein the controller is configured to control the first transporter, the second transporter, the first feed, and the second feed to provide the combined magnetic field as a controlled and calibrated magnetic field over the scanning volume; and
wherein the controller is configured to maintain a predetermined degree of flatness of the combined magnetic field.

25. A method, comprising:
positioning a vehicle on a stationary platform within a scanner, the scanner comprising:
a first coil configured to generate a first magnetic field, wherein the first coil is disposed on a first side of a scanning volume and wherein the first coil comprises a first feed for supplying electric current to the first coil,
a second coil configured to generate a second magnetic field, wherein the second coil is disposed opposite the first coil on a second side of the scanning volume opposite the first side, wherein the second coil comprises a second feed for supplying electric current to the second coil, and wherein the first magnetic field and second magnetic field combine to form a combined magnetic field,
a first transporter configured to translate the first coil in at least one dimension, and
a second transporter configured to translate the second coil in at least one dimension; and
scanning a scanning volume including the vehicle, wherein the scanning comprises controlling the first transporter, the second transporter, the first feed, and the second feed to provide the combined magnetic field as a controlled and calibrated magnetic field over the scanning volume.

26. The method of claim 25, further comprising:
maintaining the vehicle and platform stationary during the scanning.

27. The method of claim 25, further comprising:
receiving feedback from an array of free space field sensors, wherein the controlling the magnetic field is based on the feedback.

28. The method of claim 25, further comprising:
monitoring current into the first coil and the second coil, wherein the controlling the magnetic field is based on the monitored current.

29. The method of claim 25, further comprising:
evaluating magnetic immunity of the vehicle after the scanning is complete, while the scanning is on-going, or both.

* * * * *